(12) United States Patent
Yoon et al.

(10) Patent No.: US 8,755,215 B2
(45) Date of Patent: Jun. 17, 2014

(54) RESISTIVE MEMORY DEVICE

(75) Inventors: Hyunsu Yoon, Gyeonggi-do (KR); Youncheul Kim, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 130 days.

(21) Appl. No.: 13/563,290

(22) Filed: Jul. 31, 2012

(65) Prior Publication Data

US 2014/0036569 A1 Feb. 6, 2014

(51) Int. Cl.
*G11C 13/00* (2006.01)
*G11C 29/26* (2006.01)
*G11C 29/00* (2006.01)

(52) U.S. Cl.
CPC ............ *G11C 13/0002* (2013.01); *G11C 29/26* (2013.01); *G11C 29/785* (2013.01); *G11C 2213/70* (2013.01)
USPC ............ 365/148; 365/158; 365/163; 365/200

(58) Field of Classification Search
CPC ........... G11C 13/0069; G11C 13/0002; G11C 13/0004; G11C 13/0035; G11C 29/26; G11C 29/785; G11C 29/787; G11C 2013/0002; G11C 2213/10; G11C 2213/50; G11C 2213/70; G11C 2213/78
USPC ............ 365/148, 158, 163, 185.09, 200, 201, 365/230.03

See application file for complete search history.

(56) References Cited

U.S. PATENT DOCUMENTS

| | | | | |
|---|---|---|---|---|
| 6,052,318 | A * | 4/2000 | Kirihata et al. | 365/200 |
| 7,180,801 | B2 * | 2/2007 | Ferrant et al. | 365/200 |
| 7,269,047 | B1 | 9/2007 | Fong et al. | |
| 7,277,330 | B2 * | 10/2007 | Ooishi | 365/189.16 |
| 7,606,059 | B2 * | 10/2009 | Toda | 365/148 |
| 2012/0033489 | A1 * | 2/2012 | Song et al. | 365/163 |

* cited by examiner

*Primary Examiner* — Tan T. Nguyen
(74) *Attorney, Agent, or Firm* — IP & T Group LLP

(57) ABSTRACT

A resistive memory device includes a first cell array configured to store data, a second cell array configured to share column lines of the first cell array, a first error correction cell array configured to store an error correction code that corresponds to the data to be stored in the first cell array, and a second error correction cell array configured to share column lines of the first error correction cell array.

11 Claims, 5 Drawing Sheets

RESISTIVE MEMORY DEVICE

BACKGROUND

1. Field

Exemplary embodiments of the present invention relate to a resistive memory device, and more particularly, to a resistive memory device with operating stability.

2. Description of the Related Art

Generally, a fuse may be programmed in the wafer stage of a semiconductor device because data are sorted out depending on whether the fuse is cut by a laser or not. After the wafer stage of the semiconductor device is mounted as the package stage of a chip, the fuse may not be programmed.

An e-fuse, however, is used to be programmed in the various stages of the device. An e-fuse stores a data by using a transistor and changing resistance between a gate and a drain/source to the transistor.

FIG. 1 illustrates an e-fuse formed of a transistor and operating as a resistor or a capacitor.

Referring to FIG. 1, the e-fuse is formed of a transistor T, and a power supply voltage is applied to a gate G of the transistor T while a ground voltage is applied to a drain/source D/S thereof.

When a power supply voltage having such a voltage level that the transistor T may bear is applied to the gate G, the e-fuse operates as a capacitor C. Therefore, no current flows between the gate G and the drain/source D/S. When a high power supply voltage having such a voltage level that the transistor T may not bear is applied to the gate G, a gate oxide of the transistor T is destroyed to cause the coupling between the gate G and the drain/source D/S and the e-fuse operates as a resistor R. Therefore, current flows between the gate G and the drain/source D/S. According to this phenomenon, a data of an e-fuse is recognized based on the resistance value between the gate G and the drain/source D/S of the e-fuse. Here, the data of the e-fuse may be stably recognized by 1) enlarging the size of the transistor T or by 2) using an amplifier and amplifying the current flowing through the transistor T instead of increasing the size of the transistor T. The two methods, however, have a dimensional restriction because the large size of the transistor T is to be designed or an amplifier for amplifying a data is to be added to each e-fuse.

U.S. Pat. No. 7,269,047 discloses a method for decreasing the area occupied by an e-fuse by forming an e-fuse array.

FIG. 2 is a circuit diagram of a conventional cell array 200 including e-fuses.

Referring to FIG. 2, the cell array 200 includes memory cells 201 to 216 that are arrayed in N rows and M columns. The memory cells 201 to 216 include memory elements M1 to M16 and switch elements S1 to S16, respectively. The memory elements M1 to M16 are e-fuses having characteristics of a resistor or a capacitor depending on whether fuse-rupturing has occurred or not. In other words, the e-fuses M1 to M16 may be regarded as a resistive memory device for storing data depending on the value of its resistance. The switch elements S1 to S16 electrically connect the memory elements M1 to M16 with column lines BL1 to BLM under the control of row lines WLR1 to WLRN.

Hereinafter, it is described that a second row is a selected row and an $M^{th}$ column is a selected column. In other words, it is described that a memory cell 208 is a selected memory cell. Hereinafter, voltages applied to the selected memory cell 208 and unselected memory cells 201 to 207 and 209 to 216 during a program/read operation are described.

Program Operation

The row line WLR2 of the selected row is enabled and the other row lines WLR1 and WLR3 to WLRN are disabled. As a result, switch elements S5 to S8 are turned on, and the switch elements S1 to S4 and S9 to S16 are turned off. While a high voltage, which is generally generated by pumping a power supply voltage, is applied to a program/read line WLP2 of the selected row so as to destroy a gate oxide of an e-fuse, and a low-level voltage such as a ground voltage is applied to the other program/read lines WLP1 and WLP3 to WLPN. The selected column line BLM is coupled with a data access circuit, and the unselected column lines BL1 to BLM-1 are floated. The data access circuit supplies the selected column line BLM with a low-level voltage and programs a memory element M8 of the selected memory cell 208, when an inputted data is a program data, e.g., '1'. The gate oxide of the memory element M8 may be ruptured by being programmed. When an inputted data is not a program data, for example, when the inputted data is '0', the data access circuit supplies the selected column line BLM with a high-level voltage and does not program the memory element M8 of the selected memory cell 208. Since the unselected column lines BL1 to BLM-1 are floated, the memory elements M5 to M7 are not programmed although a high voltage is applied to the gates thereof.

Read Operation

The row line WLR2 of the selected row is enabled and the other row lines WLR1 and WLR3 to WLRN are disabled. As a result, switch elements S5 to S8 are turned on, and the switch elements S1 to S4 and S9 to S16 are turned off. An appropriate level of voltage for a read operation, which is generally a power supply voltage, is applied to a program/read line WLP2 of the selected row, and a low-level voltage such as a ground voltage is applied to the other program/read lines WLP1 and WLP3~WLPN. The selected column line BLM is coupled with a data access circuit, and the unselected column lines BL1 to BLM-1 are floated. The data access circuit recognizes that the memory element M8 is programmed when current flows through the selected column line BLM. In short, the data access circuit recognizes the data of the selected memory cell 208 as '1'. When no current flows through the selected column line BLM, the data access circuit recognizes that the memory element M8 is not programmed. In short, the data access circuit recognizes the data of the selected memory cell 208 as '0'.

It is illustrated above that one column line BLM is selected among the multiple column lines BL1 to BLM, but a plurality of column lines may be selected at one time. In short, a plurality of memory cells belonging to one row may be programmed/read simultaneously.

FIG. 3 is a block diagram illustrating a conventional resistive memory device including the cell array 200 shown in FIG. 2.

Referring to FIG. 3, the resistive memory device includes the cell array 200, a row circuit 310, a column decoder 320, and a data access circuit 330.

The row circuit 310 controls row lines WLR1 to WLRN and program/read lines WLP1 to WLPN to perform the program and read operations described above. An address ROW_ADD inputted to the row circuit 310 designates a row that is selected among a plurality of rows, and a program/read signal PGM/RD commands the memory device to perform a program operation or a read operation.

The column decoder 320 electrically connects a column line selected based on an address COL_ADD among a plurality of column lines BL1 to BLM with the data access circuit 330. The drawing illustrates a case that 8 column lines are selected among the column lines BL1 to BLM.

The data access circuit 330 is in charge of data access with the column lines selected by the column decoder 320. During a program operation, the data access circuit 330 controls the selected column lines to be programmed or not based on input data DATA<0> to DATA<7>. During a read operation, the data access circuit 330 senses whether current flows through the selected column lines and outputs a sensing result as an output data DATA<0> to DATA<7>.

The resistive memory device stores data by destroying or not destroying a gate oxide of a transistor that forms an e-fuse. Destroying the gate oxide may depend on the characteristics of the transistor. In other words, an error may occur in programming the resistive memory device depending on the characteristics of the transistor. Meanwhile, the resistive memory device is used to store a data that may be maintained permanently in a system, such as a repair data in a memory device, i.e., a Dynamic Random Access Memory (DRAM) device and a flash memory device. Reliability is significant for these kinds of data. Therefore, a resistive memory device is being developed to increase the data reliability thereof.

SUMMARY

An embodiment of the present invention is directed to a resistive memory device with improved data reliability.

In accordance with an exemplary embodiment of the present invention, a resistive memory device includes a first cell array configured to store data, a second cell array configured to share column lines of the first cell array, a first error correction cell array configured to store an error correction code that corresponds to the data to be stored in the first cell array, and a second error correction cell array configured to share column lines of the first error correction cell array.

The first cell array and the second cell array may store the same data at the same address, and the first error correction cell array and the second error correction cell array may store the same error correction code at the same address. The same data may be simultaneously programmed in the first cell array and the second cell array and the programmed data may be simultaneously read from the first and second cell arrays. The same error correction code may be simultaneously programmed in the first error correction cell array and the second error correction cell array and the programmed error correction code may be simultaneously read from the first and second error correction cell arrays.

In accordance with another embodiment of the present invention, a resistive memory device includes a first cell array configured to store data, a second cell array configured to share column lines of the first cell array, and an error correction cell array configured to store an error correction code that corresponds to the data to be stored in the first cell array.

DETAILED DESCRIPTION

Figure 1:
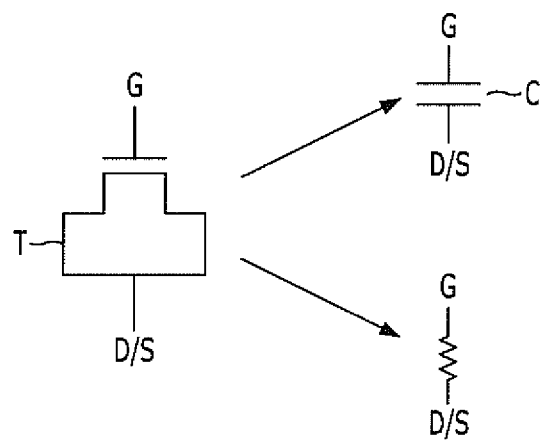
FIG. 1 illustrates an e-fuse formed of a transistor and operating as a resistor or a capacitor.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
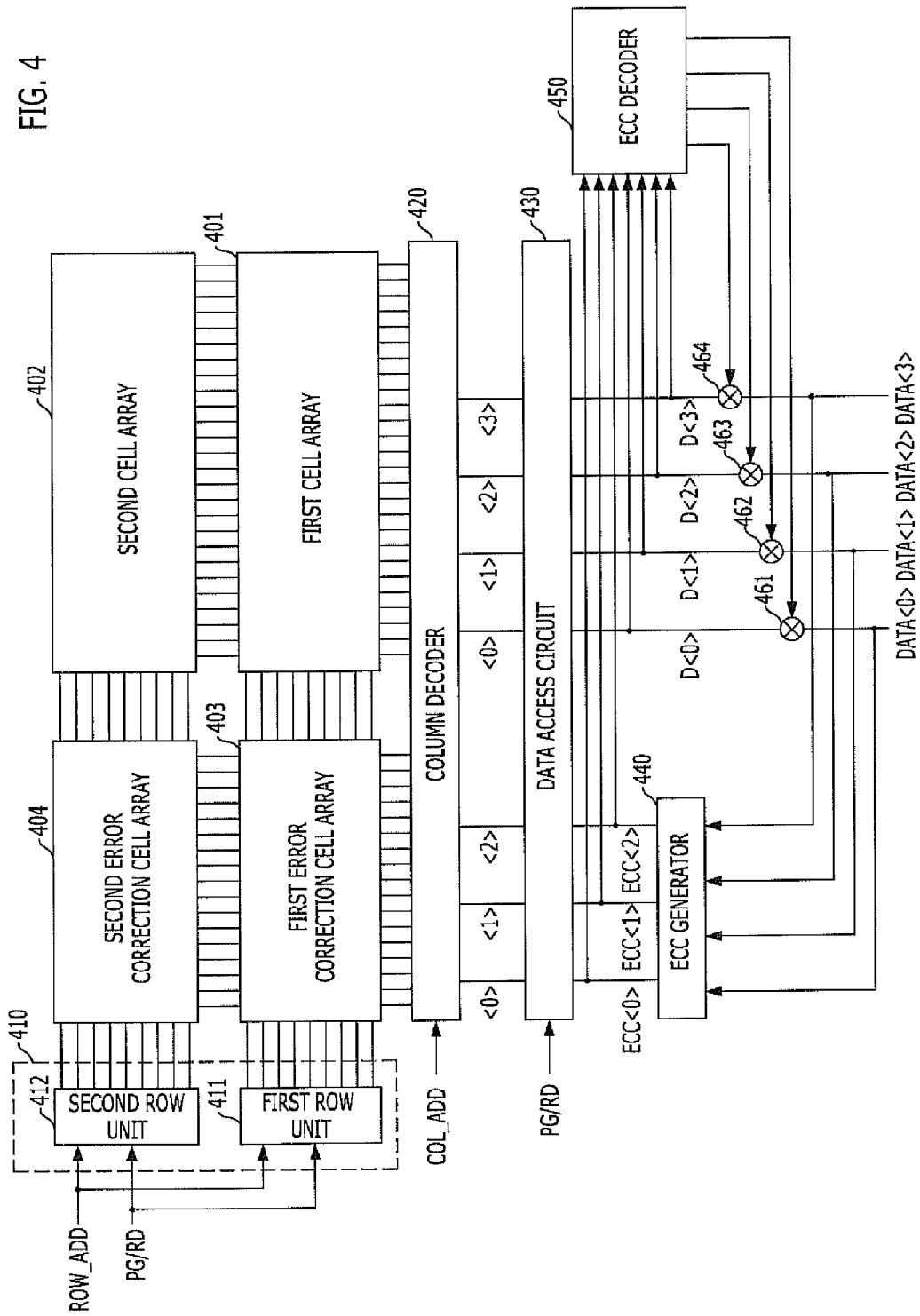
FIG. 4 is a block diagram illustrating a resistive memory device in accordance with an exemplary embodiment of the present invention.

FIG. 4 is a block diagram illustrating a resistive memory device in accordance with an exemplary embodiment of the present invention.

Referring to FIG. 4, the resistive memory device includes a first cell array 401, a second cell array 402, a first error correction cell array 403, a second error correction cell array 404, a row circuit 410, a column decoder 420, a data access circuit 430, an error correction code (ECC) generator 440, an ECC decoder 450, and correction units 461 to 464.

Figure 2:
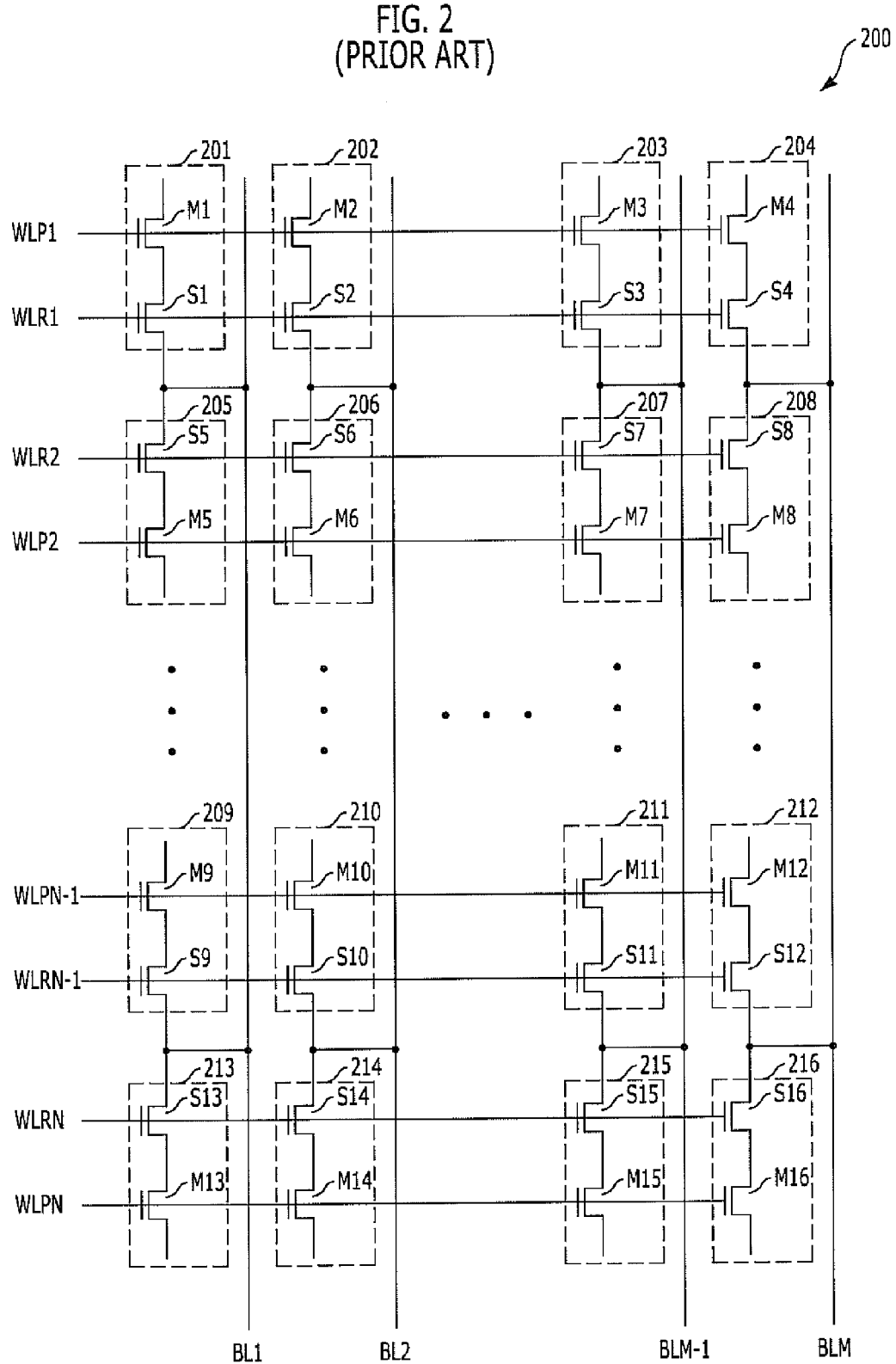
FIG. 2 is a circuit diagram of a conventional cell array 200 including e-fuses.
Figure 3:
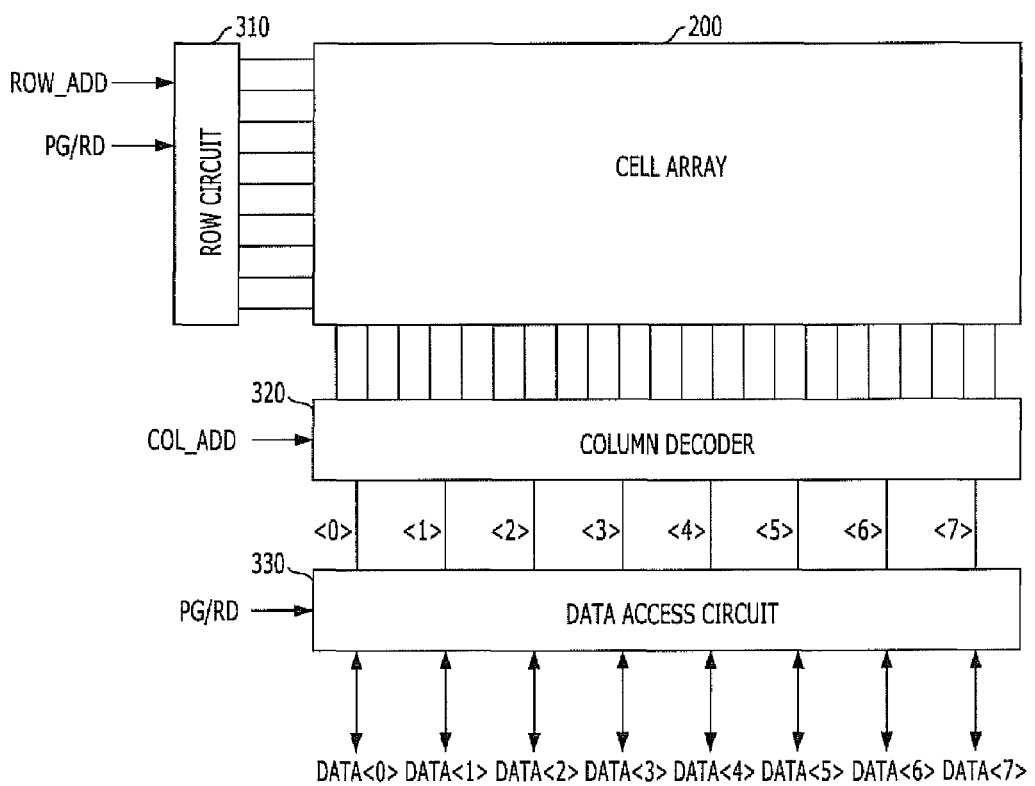
FIG. 3 is a block diagram illustrating a conventional resistive memory device including the cell array 200 shown in FIG. 2.

The first cell array 401 stores data inputted to the resistive memory device. The first cell array 401 may have the structure of the cell array illustrated in FIG. 2. The second cell array 402 stores the same data as the first cell array 401 does at the same address. For example, a data stored in the second row and the fourth column of the first cell array 401 is the same as a data stored in the second row and the fourth column of the second cell array 402. The second cell array 402 shares a column line BL with the first cell array 401, and it does not share row-based lines WLR and WLP.

The first error correction cell array 403 stores an error correction code (ECC) that corresponds to the data stored in the first cell array 401. In this embodiment, it is illustrated that a 3-bit error correction code is generated for each 4-bit data. The second error correction cell array 404 stores the same error correction code as the first error correction cell array 403 does at the same address. For example, an error correction code stored in the fifth row and the seventh column of the first error correction cell array 403 is the same as an error correction code stored in the fifth row and the seventh column of the second error correction cell array 404. The first error correction cell array 403 and the second error correction cell array 404 share a column line BL. Also, the first error correction cell array 403 and the first cell array 401 share the row-based lines WLR and WLP, and the second error correction cell array 404 and the second cell array 402 share the row-based lines WLR and WLP.

The ECC generator 440 generates an error correction code ECC<0> to ECC<2> by using a data DATA<0> to DATA<3> inputted to the resistive memory device. Although this embodiment illustrates a case that a 3-bit error correction code ECC<0> to ECC<2> is generated for each 4-bit data DATA<0> to DATA<3>, the number of bits of the error correction code ECC<0> to ECC<2> may be changed depending on an ECC scheme.

The ECC decoder 450 receives a read data D<0> to D<3> and a read error correction code S<0> to S<2> and verifies whether there is an error in the read data, and if there is an error in the read data, the ECC decoder 450 informs the correction units 461 to 464 of the error to correct the erroneous data.

The correction units 461 to 464 transfer the input data DATA<0> to DATA<3> to the data access circuit 430 as it is during a program operation, and during a read operation, the correction units 461 to 464 transfer the read data D<0> to D<3> outputted from the data access circuit 430 or inverted data of the read data D<0> to D<3> based upon the command from the ECC decoder 450.

The row circuit 410 includes a first row unit 411 and a second row unit 412. The first row unit 411 controls the row-based lines WLR and WLP to be selected based on an address ROW_ADD for a program or read operation. The second row unit 412 is designed the same as the first row unit 411 and operates the same as the first row unit 411. Therefore, when a program or read operation is performed at the $A^{th}$ rows of the first cell array 401 and the first error correction cell array 403, the program or read operation is simultaneously performed at the $A^{th}$ rows of the second cell array 402 and the second error correction cell array 404.

The column decoder 420 electrically connects the columns selected based on an address COL_ADD with the data access circuit 430. The column decoder 420 electrically connects four lines among the column lines BL shared by the first cell array 401 and the second cell array 402 with the data access circuit 430, and it electrically connects three lines among the column lines BL shared by the first error correction cell array 403 and the second error correction cell array 404 with the data access circuit 430.

The data access circuit 430 is in charge of access to data of the column lines selected by the column decoder 420. The data access circuit 430 performs a program or read operation of the error correction code ECC<0> to ECC<2> for the three column lines selected from the first error correction cell array 403 and the second error correction cell array 404, and it performs a program or read operation of the read data D<0> to D<3> for the four column lines selected from the first cell array 401 and the second cell array 402.

According to the embodiment of the present invention, the same data are simultaneously programmed to the same address in the first cell array 401 and the second cell array 402 and simultaneously read therefrom. In other words, the same data are simultaneously programmed to a memory cell at the $A^{th}$ row and the $B^{th}$ column of the first cell array 401 and a memory cell at the $A^{th}$ row and the $B^{th}$ column of the second cell array 402 and simultaneously read from the memory cells, where A and B are arbitrary positive integers. Therefore, although there is an error that memory cells are not programmed in one cell array between the first cell array 401 and the second cell array 402, the data access circuit 430 may recognize program data using memory cells in the other cell array. Likewise, when there is an error in one cell array between the first error correction cell array 403 and the second error correction cell array 404, the data access circuit 430 may correctly recognize the error correction code.

For example, in programming a program data into memory cells at the first rows and the third columns of the first and second cell arrays 401 and 402, if there is an error occurring in the first cell array 401 and the program operation is not properly performed in the first cell array 401, current does not flow from the third column of the first cell array 401 when the data access circuit 430 reads the program data. However, since current flows from the third column of the second cell array 402, the data access circuit 430 may correctly recognize the program data.

Conversely, when a memory cell that is not to be programmed is erroneously programmed, the data access circuit 430 may recognize the erroneous data. However, since such an error does not often occur in the memory device formed of a resistive memory device, such as an e-fuse, this is not significant therein. Also, since an ECC scheme is applied to the memory device in accordance with an embodiment of the present invention, such errors may be sufficiently corrected in the ECC scheme.

According to an embodiment of the present invention, the data and the error correction code are stored twice to decrease the number of occurrences of an error, and an error caused is corrected by using the ECC scheme based on the error correction code. Therefore, the data reliability of the resistive memory device may be increased.

Figure 5:
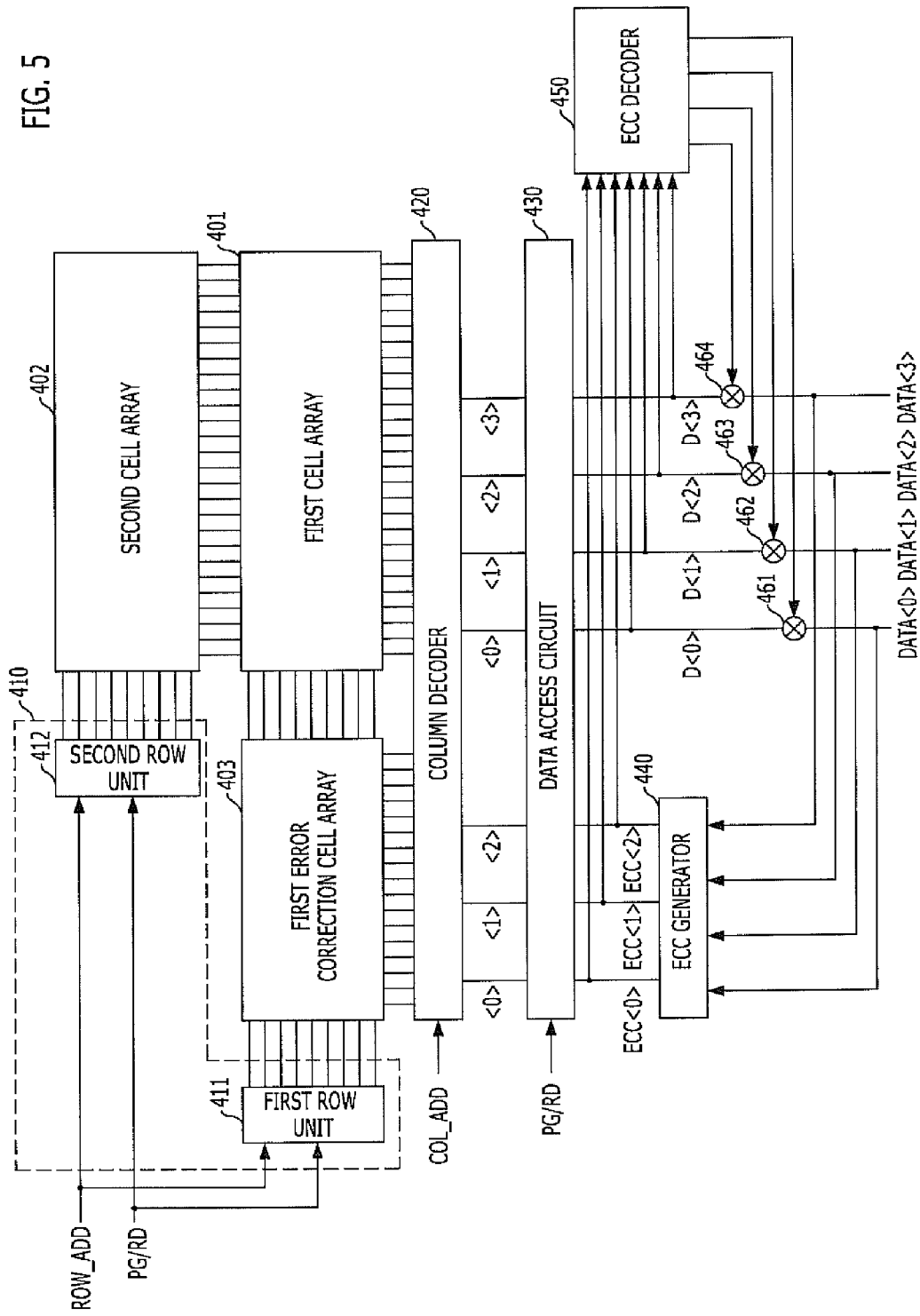
FIG. 5 is a block diagram illustrating a resistive memory device in accordance with another exemplary embodiment of the present invention.

FIG. 5 is a block diagram illustrating a resistive memory device in accordance with another exemplary embodiment of the present invention.

Referring to FIG. 5, the resistive memory device includes a first cell array 401, a second cell array 402, an error correction cell array 403, a row circuit 410, a column decoder 420, a data access circuit 430, an error correction code (ECC) generator 440, an ECC decoder 450, and correction units 461 to 464.

In the embodiment of FIG. 5, the second error correction cell array 404 of the embodiment shown in FIG. 4 is omitted. Since an error correction code is a code for correcting an error of data that are stored in the first cell array 401 and the second cell array 402, although the error correction code is stored in one error correction cell array 403, the resistive memory device may be secured with sufficient data reliability. Since the embodiment of FIG. 5 is the same as the embodiment of FIG. 4, except that the second error correction cell array 404 is omitted, further description is not provided herein.

According to an embodiment of the present invention, data are doubly stored in two cell arrays provided in a resistive memory device, and an error correction code for correcting a data error is stored. Therefore, the data reliability of the resistive memory device may be improved remarkably.

While the present invention has been described with respect to the specific embodiments, it will be apparent to those skilled in the art that various changes and modifications may be made without departing from the spirit and scope of the invention as defined in the following claims.

Particularly, the above-described embodiments of the present invention exemplarily describes a resistive memory device formed of e-fuses, it is obvious to those skilled in the art to which the present invention pertains that the technology of the present invention may be applied to increase the reliability of all kinds of resistive memory devices formed of elements other than the e-fuses.

What is claimed is:

1. A resistive memory device, comprising:
   a first cell array configured to store data;
   a second cell array configured to share column lines of the first cell array;
   a first error correction cell array configured to store an error correction code that corresponds to the data to be stored in the first cell array; and
   a second error correction cell array configured to share column lines of the first error correction cell array.

2. The resistive memory device of claim 1, wherein the first cell array and the second cell array store the same data at the same address, and
   the first error correction cell array and the second error correction cell array store the same error correction code at the same address.

3. The resistive memory device of claim 2, wherein the same data are simultaneously programmed in the first cell array and the second cell array and the programmed data are simultaneously read from the first and second cell arrays, and the same error correction code are simultaneously programmed in the first error correction cell array and the second error correction cell array and the programmed error correction code are simultaneously read from the first and second error correction cell arrays.

4. The resistive memory device of claim 1, wherein the first cell array and the first error correction cell array are configured to share row lines, and the second cell array and the second error correction cell array are configured to share the row lines.

5. The resistive memory device of claim 4, further comprising:
   a row decoder circuit configured to select one of the row lines of each of the first cell array and the second cell array;
   a column decoder circuit configured to select at least one of the columns of the first cell array and the second cell array; and
   a data access circuit configured to program the data in the first and second cell arrays and read the programmed data from the first and second cell arrays through the selected column.

6. The resistive memory device of claim 5, wherein the data access circuit recognizes a data of a memory cell at an $A^{th}$ row and $B^{th}$ column of the first cell array using a data of a memory at an $A^{th}$ row and $B^{th}$ column of the second cell array, where A and B are positive integers.

7. The resistive memory device of claim 5, wherein the row decoder circuit selects one of the row lines of each of the first error correction cell array and the second error correction cell array, and the column decoder circuit selects at least one of the columns of the first error correction cell array and the second error correction cell array.

8. The resistive memory device of claim 1, wherein each of the first cell array, the second cell array, the first error correction cell array, and the second error correction cell array includes a plurality of e-fuses.

9. The resistive memory device of claim 5, further comprising:
   an error correction code generator configured to generate the error correction code in response to the data;
   an error correction code decoder configured to verify the read data in response to the error correction code; and
   a correction unit configured to transfer the read data by inverting the read data in response to an output of the error correction code decoder.

10. A resistive memory device, comprising:
    a first cell array configured to store data;
    a second cell array configured to share column lines of the first cell array; and
    an error correction cell array configured to store an error correction code that corresponds to the data to be stored in the first cell array.

11. The resistive memory device of claim 10, wherein the same data are simultaneously programmed in the first cell array and the second cell array and the programmed data are simultaneously read from the first and second cell arrays.

* * * * *